United States Patent [19]

Jacobson

[11] Patent Number: 4,800,374
[45] Date of Patent: Jan. 24, 1989

[54] PERSONNEL ANTISTATIC TEST DEVICE

[75] Inventor: Terry W. Jacobson, Chippewa Falls, Wis.

[73] Assignee: Cray Research, Inc., Minneapolis, Minn.

[21] Appl. No.: 925,283

[22] Filed: Oct. 31, 1986

[51] Int. Cl.$^4$ ............................................. G08B 21/00
[52] U.S. Cl. .................................... 340/649; 324/509; 361/212
[58] Field of Search ...................... 361/223, 212, 224; 340/649; 324/64 R, 62 R, 509, 510, 557

[56] References Cited

U.S. PATENT DOCUMENTS

| 2,401,917 | 6/1946 | Drake | 324/64 |
| 3,277,364 | 10/1966 | Abrahamson | 324/64 |
| 4,529,929 | 7/1985 | Berggren | 324/509 |

OTHER PUBLICATIONS

Brochure: "Wrist Strap System Tester-WSST 300", of Voyager Technologies, Inc., Langhorne, PA 19037.

Primary Examiner—Reinhard J. Eisenzopf
Assistant Examiner—Jose M. Solis
Attorney, Agent, or Firm—Merchant, Gould, Smith, Edell, Welter & Schmidt

[57] ABSTRACT

A personnel antistatic test device includes a conductive shoe plate adapted to be stood upon by the person to be checked, a jack for receiving the plug of a wrist strap worn by the person to be checked, and circuitry for measuring effectiveness of static discharge paths through the wrist strap and through the person's footwear. Electrical circuitry is provided for measuring resistance from a touch plate, through the person's body, through the wrist strap and its lead wire. In the footwear checking mode, resistance is measured from the touch pad through the person's body, through the stockings and shoes to the shoe plate. Appropriate resistance range values are provided for the wrist strap and shoe check mode, and indicator lights are activated showing a satisfactory static discharge path, a hazard condition due to low resistance, or an unacceptable static discharge path due to high resistance.

1 Claim, 2 Drawing Sheets

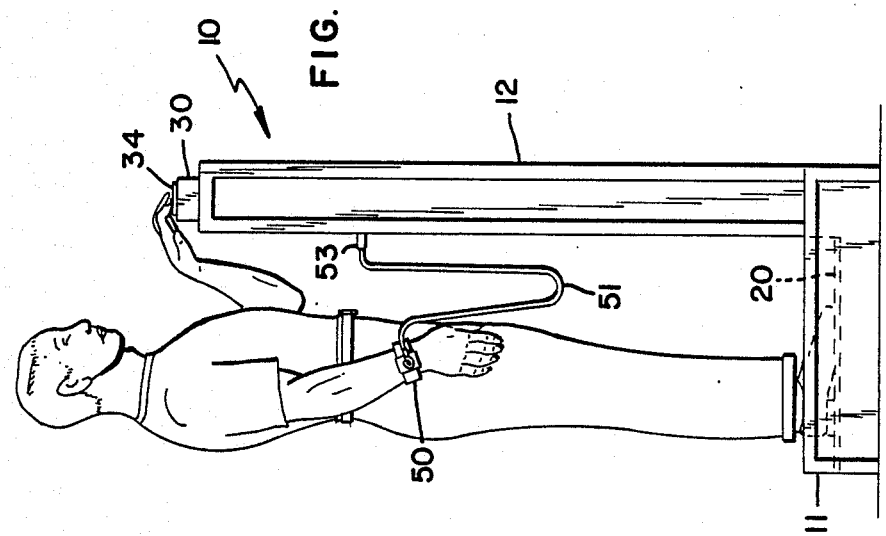
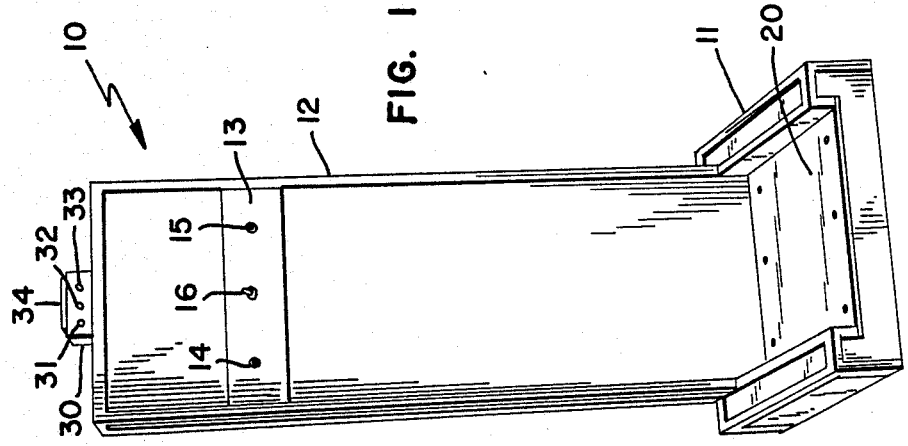

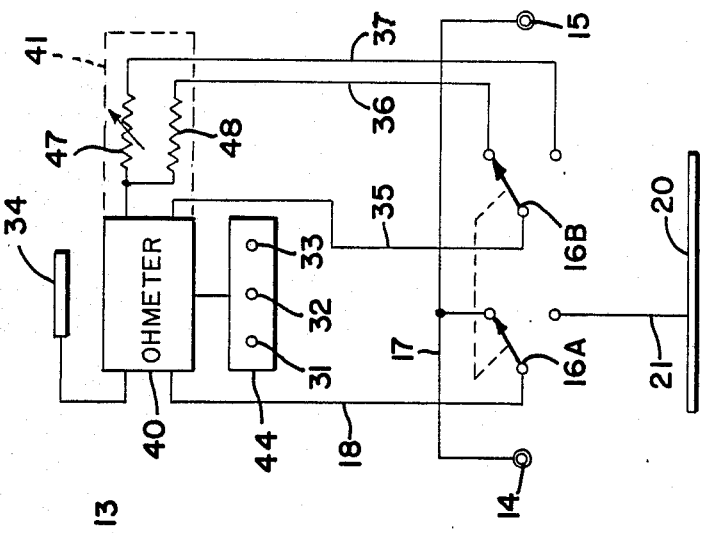
FIG. 4
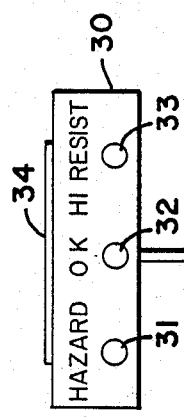
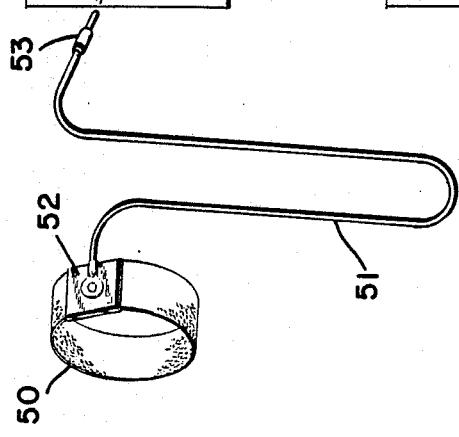
FIG. 3

PERSONNEL ANTISTATIC TEST DEVICE

Field of the Invention

This invention pertains to the field of controlling electrostatic discharge in the electronics industry and specifically to a device for checking and verifying the effectiveness of wrist straps and shoes worn by personnel involved in handling integrated circuits which are prone to damage by electrostatic discharge.

BACKGROUND OF THE PRIOR ART

Electrical overstress of electronic components due to electrostatic discharge (ESD) is a serious problem in the electronics industry. The damaging effects of electrostatic discharge on integrated circuits are well known, and it is generally recognized that such damage can occur at any point during the manufacture, testing, repair, and even normal use of electronic equipment using such integrated circuits. Despite precautions which have been adopted in the industry, the problem has become more severe, due in part to the more widespread use of integrated circuits, the smaller sizes of devices and higher packaging densities, and due in part to the fact that newer generations of integrated circuits have greater susceptibility to electrical overstress at lower voltages than earlier generations.

The cost to industry due to electrostatic discharge is very high, and is measured in terms of the cost of the destroyed circuits, the time spent in troubleshooting and replacing damaged circuits, and in terms of economic loss and disruption caused by failures of equipment in the field. This is due to the fact that while some electrostatic discharge causes immediate failure of circuits which would be detected by functional tests in the manufacturing process, in other instances the electrostatic discharge causes latent damage which may cause a circuit to fail at some subsequent time. Such failures while equipment is in the field are even more costly because of the down time for equipment, for example, expensive computer systems, and because of the greater time and expense of repairing equipment in the field as compared to in the factory. Further, for some types of critical electronic equipment, for example, in the fields of medicine or aviation, such failures could pose safety hazards.

Typical static control measures used in the electronics industry include wrist straps for personnel which are connected to ground for removing static charges, special antistatic clothing for personnel, special containers for holding circuit boards or circuits, special temperature and humidity controls for work areas, conductive flooring and static dissipative shoes. These techniques are all useful in controlling the static buildup problem, but problems still occur.

It is generally thought that the personnel wrist strap grounding system is the most effective single measure for static control. The wrist strap consists of an elastic cuff having conductive material woven therein which fits snugly around the wrist of a person involved in assembly, repair or other handling of the integrated circuits or circuit boards. The wrist strap connects through a lead wire to a plug which is intended to be plugged into a grounding jack. Numerous grounding jacks are provided around the work benches and other work areas involved. The purpose is to provide a path to bleed off or discharge any static level which would be built up on the person's skin, and thus prevent a static voltage buildup which could damage the circuits. A resistor is provided in the lead wire for safety purposes to limit current through the body in case the person should inadvertently come in contact with an electrical power source. The resistance is high enough to substantially limit any such accidental current to safe levels, and is low enough to keep the discharge time for static charges on the body fast enough to avoid damage to the circuits. Typically, a one-megohm resistor is used, although in some cases a lower resistance of 500 kilohms might be used for certain newer types of integrated circuits having lower electrical overstress voltage limits.

Wrist straps may fail to provide adequate static charge dissipation under some circumstances. The resistance of the skin can vary from individual to individual, and can be affected by factors such as perspiration or lack thereof, room temperature and humidity. In addition, it has been found that a leading cause of wrist strap grounding system failure is due to broken lead wires. The lead wire connecting from the wrist strap and terminating in the grounding plug is subject to a considerable amount of physical movement while being worn during a typical work day. The person will typically plug into and unplug from grounding jacks in the work area dozens of times each day. In addition, the person's hand may be in continual motion while working. All of these factors place great strain on lead wires, with the result that the wires or the resistors within the lead wires will break with a surprising degree of frequency. Since a failure of the wrist strap system creates a potential for electrostatic discharge damage until the defective system is found and replaced, periodic testing of wrist strap effectiveness is to be recommended, and numerous test devices are available on the market. Typically they are ohmmetertype devices wherein the person wearing the wrist strap plugs the grounding lead wire into the test device then touches a conductor with the opposite hand. The ohmmeter device then measures resistance through the complete circuit including the skin to wrist strap contact, the lead wire and its resistor. The device then indicates that the system is satisfactory; that the resistance too low, indicating a shorted resistor and a potential personal hazard; or that the resistance is too high or open circuit, indicating that the system will not protect against static.

These types of testers generally work well when used frequently and regularly, but even then problems will occur. Even if wrist strap systems are tested daily, when a failure does occur, and it can be assured that failures eventually will occur, they will go undetected throughout the rest of the day, during which time the person wearing the defective wrist strap system may have handled hundreds of circuits, circuit board assemblies or the like. The standard industry approach to this problem has been to rely on a secondary static discharge path through the worker's footwear to conductive flooring material installed in the electronic assembly areas. However, experience has shown that this reliance is in many cases misplaced.

In the course of development of this invention, it was found that resistance levels from a person through his footwear to conductive flooring is not only higher than the resistance through a proper wrist strap system, but also that it is subject to a much greater degree of variability than for wrist straps. The composition of the sole of the shoe, the type of material in the stockings, and individual variability in skin resistance and foot perspiration, in addition to the usual temperature and humidity factors, cause great variability. Leather soled shoes may have low conductivity if there is high humidity or if the leather otherwise has a certain moisture content, but they have very high resistance when completely dry. Special ESD shoes have been developed with a composition sole having a known degree of conductivity, but still the other factors mentioned above cause such variability in resistance that it has been found that at a given time a large percentage of the personnel working in a static protected zone may have inadequate grounding through their footwear. For example, it has been found that a draft along the floor in an area of a room can slightly chill the feet of persons working in that area, which can lead to a decrease in foot perspiration and an increase in resistance.

Because of these problems, a program of checking the static discharge path through the shoe should also be implemented in addition to checking wrist strap systems. The test should be quick and simple to perform, because otherwise there may be a tendency to skip the test. However, no effective or reliable footwear conductivity path measurement apparatus is available.

SUMMARY OF THE INVENTION

In order to overcome these and other problems existing in the prior art, the present invention provides an accurate and effective system for checking ESD effectiveness of both wrist strap systems and footwear. The system is simple and quick to use and lends itself to daily or more frequent regular use at the actual location where workers will be handling integrated circuits and circuit assemblies. By testing both the wrist strap system and the backup footwear floor contact system for static discharge, greater levels of protection can be achieved than heretofore possible against the damaging effects of electrostatic discharge on electronic components.

BRIEF DESCRIPTION OF THE DRAWINGS

In the drawing,

FIG. 1 is a view in perspective of a personnel antistatic test device according to the present invention;

FIG. 2 is a view in side elevation of the test device of FIG. 1, illustrating the use thereof;

FIG. 3 is a schematic diagram illustrating the use of the antistatic test device; and FIG. 4 is an electrical schematic diagram of the antistatic test device.

DETAILED DESCRIPTION OF THE PREFERRED EMBODIMENT

The preferred overall configuration of the personnel antistatic test device of the invention is indicated generally by reference number 10 in FIGS. 1 and 2. The test device includes a base 11 which is adapted for standing upon by personnel being checked, and a cabinet or vertical riser 12 which extends upwardly from base 11 to place the necessary controls and indicators at a convenient height for the person using the device. The base 11 and cabinet 12 can be made of any suitable material and in any desired shape or configuration. In the preferred embodiment they are made of wood. Also, the cabinet can be made independent of the base for permanent mounting to a wall above the base or the like, in which case a separate connection cable would be provided between them. However, it is believed that the embodiment shown is advantageous in that it can be easily moved from one location to another within the manufacturing facility as needed.

Base 11 has a shoe plate 20 mounted therein for the person to stand on. Plate 20 is conductive, and in the preferred embodiment a heavy duty stainless steel plate is used. It is positioned horizontally a convenient distance off the floor, for example a few inches, and is held in place by suitable means, such as screws. Since shoe plate 20 is used for conductivity measurements, it should be electrically insulated from other components in the system. If desired, plate 20 can be mounted in a small recess as shown, so that portions of base 11 on either side thereof form small side walls as a guide to foot position when using the device.

Cabinet 12 has a control panel 13 mounted on the front side thereof at a convenient height above the base to permit visibility and accessibility thereof when the device is used by personnel being tested. Control panel 13 includes a pair of electrical jacks 14, 15 spaced to either side thereof, and a centrally mounted switch 16. Labels for these components are also provided, as seen in FIG. 3.

At the top of cabinet 12 is an electronic box 30, in which is mounted the electronic resistance measurement circuitry. Electronic box 30 has indicator lights 31, 32, 33 on its front panel in a position to be visible to personnel using the test device. In addition, it has a touch plate 34 mounted thereon which is positioned to be touched by the hand of the person being tested.

Elastic wrist strap 50 is seen in FIGS. 2 and 3. It may be of any type as is generally commercially available, for example, a type made by 3M Company as disclosed in U.S. Pat. No. 4,398,277. The cuff has conductive material woven therein which makes contact to the skin of the wearer. A lead wire 51 connects from a connector 52 on the wrist strap and terminates in a plug 3. A resistor, usually of one megohm resistance, is included in lead wire 51 so as to provide safety resistance between wrist strap 50 and the conductor at the tip of plug 53. Plug 53 is of course adapted to be plugged into grounding jacks provided along work benches or other work areas where the person will be handling the electronic components. For purposes of the test device, jacks 14 and 15 are provided to receive plugs 53 of wrist straps 50.

As seen in FIG. 4, jacks 14 and 15 are connected together by a conductor 17. Switch 16 is a double pole, double throw switch having poles 16A and 16B. Conductor 17 connects to the terminal contacted by pole 16A when the switch is in the WRIST STRAP CHECK position. The other terminal which connects to 16A in the SHOE CHECK position connects ia conductor 21 to shoe plate 20. This wire is mechanically and electrically secured to make reliable contact with the stainless steel plate 20. Pole 16A connects to conductor 18, so that conductor 18 is connected either to a wrist strap 50 or to shoe plate 20, depending upon the position of switch 16.

The other pole 16B of the switch connects to lead 35. The terminals which can be contacted by pole 16B in the WRIST STRAP CHECK and SHOE CHECK positions are connected to conductors 36 and 37, respectively. These conductors are used for range or scale switching of the measurement circuitry.

An electronic ohmmeter 40 is provided for making the resistance or conductivity measurements. It includes a range or scale calibration network 41. Ohmmeter 40 connects to resistance range indication network 44 which includes indicator lights 31, 32 and 33. Ohmmeter 40 is connected to receive conductor 18, which connects from the wrist strap or the shoe plate, depending upon the position of mode switch 16, and also is connected to touch plate 34.

Ohmmeter 40, network 41 and indication means 44 operate as follows. The resistance, or conductivity, is measured between conductors 34 and 18, that is, between touch plate 33 and either the wrist strap 50 or shoe plate 20, depending upon the position of the mode switch. The system thus measures conductivity through the person and the static charge dissipation systems. In the case of a wrist strap check, the resistance should be at the level of the safety resistor in lead 51 or higher, but not so high as to substantially increase the time required for discharge of static buildup on the person. For a wrist strap resistor of one megohm, the system of the preferred embodiment is set to indicate resistance of less than 750 kilohms as being a hazardous condition, and indicator light 31 will be lit to indicate HAZARD. A resistance of between 750 kilohms and 10 megohms is considered normal and acceptable for electrostatic discharge suppression, and if a resistance in this range is measured, indicator light 32 is illuminated to indicate that the system is "OK". A resistance of over 10 megohms is considered unacceptable for ESD suppression, and if the resistance measures over 10 megohms, indicator light 33 is illuminated to indicate HIGH RESISTANCE. The above-noted ranges can be modified through changes in circuitry in ohmmeter 40, network 41, or indicator circuitry 44. For example, in the case of certain very highly sensitive integrated circuits, the resistor in the wrist strap system may be reduced to 500 kilohms, and the resistance ranges for indicator lights 31, 32 and 33 might be reduced downwardly accordingly.

For shoe checking, the preferred embodiment is designed to give a HAZARD indication by lighting indicator 31 if the measured resistance between shoe plate 20 and touch plate 34 is zero to 750 kilohms. This again provides the personal safety factor against complete grounding. The system is designed to provide an "OK" indication by lighting indicator light 32 if the measured resistance is between 750 kilohms and 500 megohms, and a HIGH RESISTANCE indication by lighting indicator 33 if the measured resistance is over 500 megohms. It has been found that these ranges provide useful and reliable indications of the effectiveness of the static discharge path through the footwear.

Ohmmeter 40, scaling network 41 and resistance range indicator 44 can be of any electronic design as is generally known in the art. In the preferred embodiment, these components are provided through modifications to a commercially available wrist strap system testor, Model WSST-300, by Voyageur Technologies, Icc. of Langhorne, Pa. That device includes a touch plate 34 in the form of its top outer chassis cover, and another jack for the other connection through which conductivity is to be measured. The unit also includes circuitry for measuring the resistance and driving HAZARD, OK and HIGH RESISTANCE indicators, as discussed above. However, the scale or sensitivity of the device is not suitable for use in the present invention. Suitable modifications to the unit can be made as follows. The WSST-300 unit has an upper limit range switch designed to switch the upper range between 10 megohms and 100 megohms, which is intended to cover different types of wrist straps. This switch, which connects to resistors, is removed from the circuitry and replaced by pole 16B of switch 16, which connects to scaling resistors 47 and 48. However, one of them, resistor 47 for the shoe check, is changed from a 220-ohm resistor as supplied in the unit to a 100-ohm potentiometer, which then is adjusted to give the desired 500-megohm limit indication for the "OK" condition. While the resistance measurement and indication for the preferred embodiment is provided by modifications described above to a commercially available unit, it would be appreciated that other types of modifications could be provided or other types of resistance measurement circuits could be provided for performing the same function.

In operation, the person to be checked simply stands on the base 21, as indicated in FIG. 2. With switch 16 moved to the WRIST STRAP CHECK position, the person plugs in plug 53 of his wrist strap to either jack 14 or 15, depending upon whether the person is wearing the wrist strap on the right or left hand. The person then touches touch plate 34 with the opposite hand and watches the indicator panel. If the "OK" light is lit, the wrist strap static discharge path, running through the person's body, through the skin-to-strap interface, through the safety resistor, lead wire and plug, is in working order. If either indicator 31 or 33 lights, there is an error and the strap system must be rechecked or replaced. The person then moves switch 16 to the SHOE CHECK position and again touches touch plate 34 with the hand. Resistance through the person's body, through the skin-sock-shoe interface and through the footwear to plate 20 is then checked. If this discharge ground path is good, the "OK" light will light. If either the HAZARD light or the HIGH RESISTANCE light comes on, the footwear discharge path is not acceptable and further checking or changes of footwear will be needed.

Since the unit is self-contained and relatively small, numerous units can be placed throughout the electronic manufacturing assembly, preferably one adjacent each small numbered group of workers. The simplicity and speed with which a test can be performed are important in encouraging full compliance by personnel with established testing procedures. Tests which are time-consuming or complicated can lead to shortcutting or bypassing of procedures, with a predictable increase in ESD damage. This personnel antistatic test device, together with diligent periodic checking at regular, close-spaced intervals will contribute greatly to elimination of electrostatic discharge and reducing the high costs that have resulted from static-damaged circuits.

What is claimed is:

1. Apparatus for testing effectiveness of personnel static discharge paths through footwear and wrist straps, comprising:

a housing including a base portion configured and positioned for standing upon by a person to be checked and a control panel portion positioned above said base portion at a convenient height to permit manual access to said control panel by a person on said base;

a terminal member positioned on said control panel and adapted for electrical connection to a wrist strap;

a first conductive member adapted for shoe contact, and means positioning it on said base portion for standing upon by a person to be checked;

a second conductive member positioned on said housing and adapted for being touched by a hand of a person being checked;

electrical resistance measurement and indication means including means mounted in said housing for connecting said first and second conductor members and said terminal member thereto, said resistance measurement and indication means operative in a first mode for measuring electrical resistance between said terminal member and said second conductive member and in a second mode for measuring electrical resistance between said first and second conductive members, and for indicating that the resistance being measured is within one of the predetermined low, medium or high resistance ranges; and switching means operatively connected to said resistance measurement and indication means and selectively operative to cause said electrical resistance measurement in said first mode and for selecting a set of predetermined low, medium and high resistance ranges for wrist strap testing, and selectively operative to cause said electrical resistance measurement in said second mode and for selecting a second set of predetermined low, medium and high resistance ranges for checking the static discharge path through footwear;

whereby said apparatus provides indications of potential hazards due to low resistance, satisfactory electrostatic discharge path, or unsatisfactory electrostatic discharge path due to high resistance, for the wrist strap and footwear of a person being checked.

* * * * *